(12) United States Patent
Wood et al.

(10) Patent No.: US 7,186,645 B2
(45) Date of Patent: Mar. 6, 2007

(54) SELECTIVE PLATING OF PACKAGE TERMINALS

(75) Inventors: Dustin P. Wood, Chandler, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/685,171

(22) Filed: Oct. 13, 2003

(65) Prior Publication Data
US 2005/0112880 A1 May 26, 2005

(51) Int. Cl.
*H01L 21/44* (2006.01)
(52) U.S. Cl. ............... 438/652; 438/674; 257/E21.295
(58) Field of Classification Search ............... 438/584, 438/597, 612, 652, 653, 674, 678
See application file for complete search history.

(56) References Cited

U.S. PATENT DOCUMENTS

| | | | |
|---|---|---|---|
| 6,110,813 A * | 8/2000 | Ota et al. | 438/597 |
| 6,599,767 B1 * | 7/2003 | Li | 438/22 |
| 6,709,980 B2 * | 3/2004 | Gleason | 438/678 |
| 6,975,025 B2 | 12/2005 | LeBonheur et al. | |
| 2005/0121764 A1 | 6/2005 | Mallik et al. | |

\* cited by examiner

*Primary Examiner*—Scott B. Geyer
(74) *Attorney, Agent, or Firm*—Blakely Sokoloff Taylor & Zafman LLP

(57) ABSTRACT

In one embodiment, a method including providing a semiconductor pad package having a first pad and a second pad is disclosed. A first layer comprising a first metal is deposited on the first pad using a first process. A second metal is then deposited on the first pad and the first layer using a second process. In another embodiment, the first process comprises and electroplating process, and the second process comprises a direct immersion gold (DIG) process. In a further embodiment, the first pad is a power or ground pad, and the second pad is a signal pad.

16 Claims, 9 Drawing Sheets

SELECTIVE PLATING OF PACKAGE TERMINALS

FIELD OF THE INVENTION

The invention generally relates to semiconductor packaging. More specifically, the invention relates to plating package terminals to improve terminal performance.

BACKGROUND

An integrated circuit (IC) is formed by processing a silicon or other semiconductor substrate. The processing creates semiconductor devices such as transistors, resistors, etc. on the substrate. The semiconductor die that results is typically very small and fragile. A semiconductor package encases the die, protecting the die and making it easier to handle. The package also includes a package substrate to direct power and signals to and from the die. The package substrate includes several terminals (or pads) on the bottom of the package to form external connections.

FIG. 1A illustrates a bottom view of a semiconductor package. The package 10 has several terminals on the bottom of the package. The terminals are connected with interconnect devices to form external connections. The interconnect devices may be, for example, ball grid array (BGA), pin grid array (PGA), or land grid array (LGA) interconnects. Before the interconnect is attached to the terminal or pad, the pad is plated to provide protection from electromigration, oxidation, joint failure, and signal degradation.

Several varieties of terminals are shown on the package 10. The signal pads 12 route signals to and from a die. The power pads 14 deliver power to the die. The ground pads 16 provide a ground for the die. Each of the different types of pads has different needs. For example, the signal pads 12 must deliver a clean signal. The power pads 14 and ground pads 16 need to tolerate high currents.

FIG. 1B illustrates a cross sectional view of semiconductor package terminals having protecting plating layers. As can be seen in FIG. 1B, the package substrate 18 includes pads 12, 14, and 16. All of the pads 12, 14, and 16 have been plated with a layer of immersion gold 20. The immersion gold layer 20 maintains good interconnect solder joint strength. However, the immersion gold layer 20 alone leaves the power pads 14 and ground pads 16 susceptible to electromigration. Electromigration is caused by an intermetallic copper-tin compound created at the joint between tin solder and copper terminals. Electromigration is aggravated by the high currents that the power and ground pads 14 and 16 carry. This problem is typically encountered when using BGA interconnects.

FIG. 1C illustrates a cross sectional view of a semiconductor package including pads that are coated using an electroless nickel—immersion gold (ENIG) process. The package 30 includes pads 12, 14, and 16, that are part of the package substrate 18. The ENIG process deposits a layer of electroless nickel 32 and a layer of immersion gold 20 on the pads 12, 14, and 16. The electroless nickel layer 32 protects the power pads 14 and ground pads 16 from electromigration failures, but weakens the joints between interconnects and the pads 12, 14, and 16.

FIG. 1D illustrates a semiconductor package having pads with electroplated copper and immersion gold layers deposited thereon. The package 40 includes several pads 12, 14, and 16, having first deposited thereon an electroplated nickel layer 42. Electroplating requires that a tie bar (not shown) be attached to each pad so that current can be driven through the pads. The tie bars are removed after the nickel layer 42 is deposited, however, short stubs 44 will remain on the pads 12, 14, and 16. Electroplating may be inappropriate for signal pads 12, since the stubs 44 may impair the signal integrity of the signal pads 12. The stubs 44 can create an impedance discontinuity resulting in a reflected wave which negatively affects signal integrity. An immersion gold layer 20 is deposited over the electroplated nickel layer 42. The immersion gold layer 20 again provides for a strong interconnect joint.

An immersion gold layer 20 is added to improve solder joint strength. A nickel layer, either the electroplated nickel layer 42 or the EL nickel layer 32, is added to prevent electromigration in the power and ground pads 14 and 16. The electroplated nickel layer 42 leaves stubs 44 which can affect signal integrity on signal pads 12. Further, the EL nickel layer 32 weakens the solder joints.

DETAILED DESCRIPTION

Described herein is a method and apparatus for selective plating of package terminals. In the following description numerous specific details are set forth. However, it is understood that embodiments may be practiced without these specific details. For example, well known equivalent materials may be substituted in place of those described herein and similarly, well known equivalent techniques may be substituted in place of particular semiconductor processing techniques disclosed. In other instances, well known structures and techniques are not shown in detail in order not to obscure the understanding of this description.

According to an embodiment of the present invention, different terminals (or pads) included in package substrates to form external connections are plated with different metals using different processes. Power and ground pads are electroplated with nickel to form a strong, electromigration resistant coating. However, the tie bars required for electroplating leave stubs, which may degrade signals. As a result, signal pads are not electroplated. If a land grid array (LGA) interconnect is used, an electroless (EL) nickel layer is deposited on the signal pads and the electroplated nickel layer on the power and ground pads. The EL nickel layer protects pads used in an LGA package from oxidation. After the nickel layer(s) have been added, an immersion gold layer deposited using a direct immersion gold (DIG) process is added to the exposed pads or layers, as the case may be. The immersion gold layer ensures good joint strength between the interconnects and the pads.

Figure 1A:
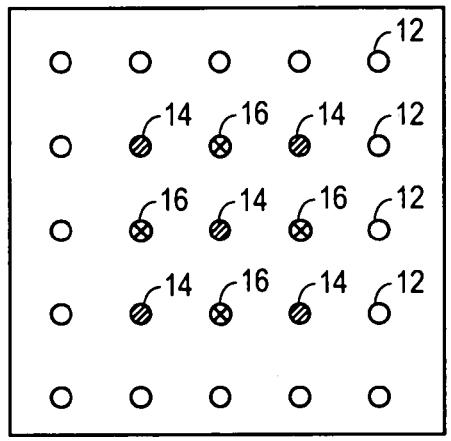
FIG. 1A illustrates a bottom view of a semiconductor package.
Figure 1B:
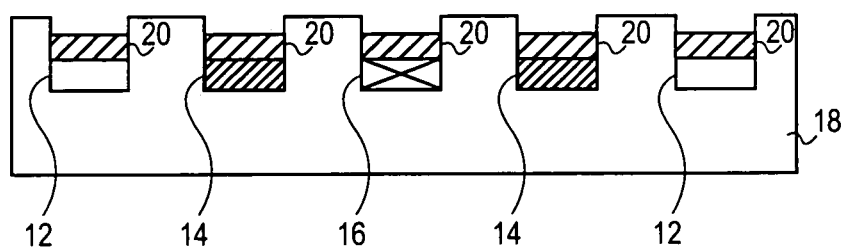
FIG. 1B illustrates a cross sectional view of semiconductor package terminals having protecting plating layers.
Figure 1C:
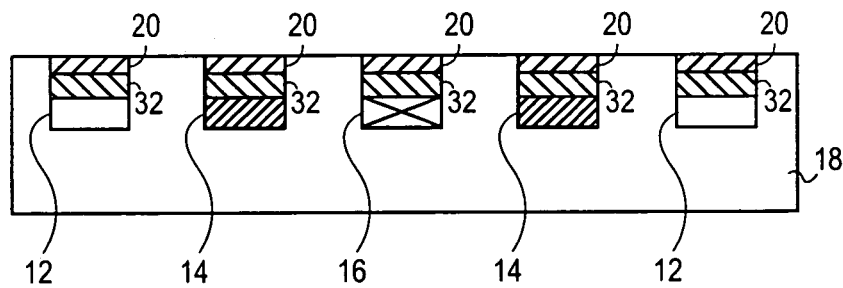
FIG. 1C illustrates a cross sectional view of a semiconductor package including pads that are coated using an electroless nickel—immersion gold (ENIG) process.
Figure 1D:
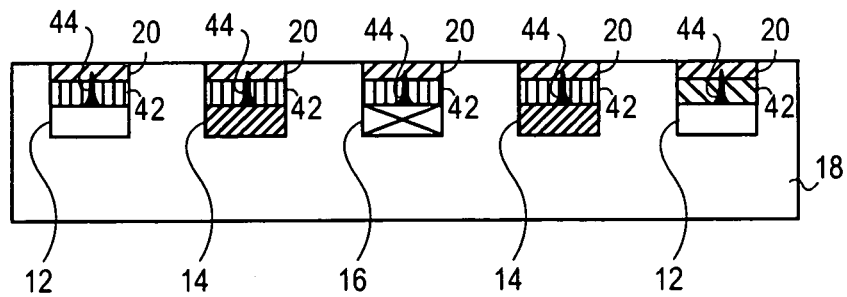
FIG. 1D illustrates a semiconductor package having pads with electroplated copper and immersion gold layers deposited thereon.
Figure 2A:
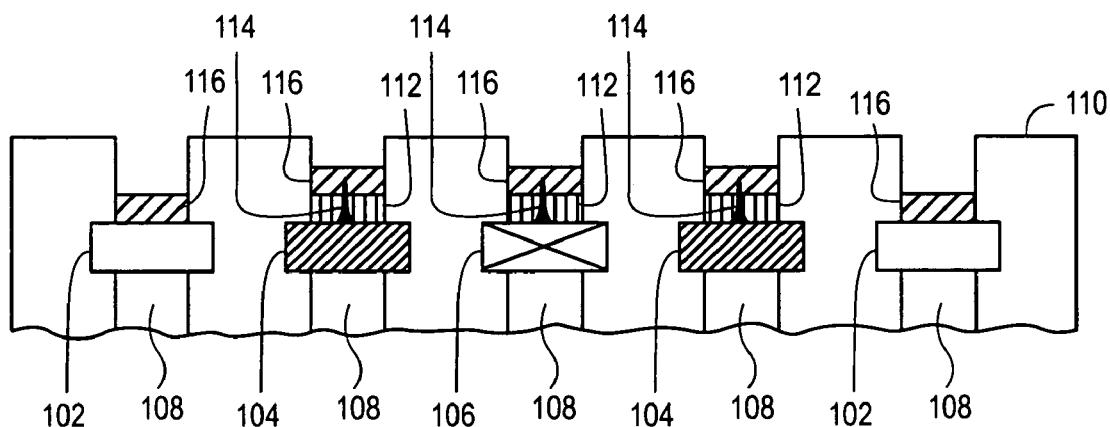
FIG. 2A illustrates a Ball Grid Array (BGA) or Pin Grid Array (PGA) package substrate according to one embodiment of the invention.

FIG. 2A illustrates a Ball Grid Array (BGA) or Pin Grid Array (PGA) package substrate according to one embodiment of the invention. The package substrate 100 includes signal pads 102, power pads 104, and a ground pad 106. The package substrate 100 may include any number or configuration of these pads depending on the needs of the particular application. The pads 102, 104, and 106 are formed at the ends of vias 108. The signal pads 102 deliver signals to a semiconductor die, the power pads 104 can deliver a power signal of varying voltages (such as $V_{CC}$, +3.3V, +2.7V, etc.), and the ground pad 106 delivers a ground signal to the semiconductor die. It is understood that although the pads 102, 104, and 106 are shown deeply recessed in the package substrate 100 to more clearly show an embodiment of the invention, that the pads are generally exposed on the top surface 110 of the package substrate 100.

The pads 102, 104, and 106 are selectively plated using various metals to provide various benefits. The power and ground pads 104 and 106 first have an electroplated nickel layer 112 deposited on them. The electroplated nickel layer 112 provides electromigration protection while maintaining a strong solder joint between the pads 104 and 106 and the BGA or PGA interconnects. A tie bar stub 114 remains after the electroplating process is completed. After the electroplated nickel layers 112 are deposited, an immersion gold layer 116 is deposited on the signal pads 102 and on the electroplated nickel layers 112. The immersion gold layer 116 promotes strong solder joints. In one embodiment, the plated layers shown in FIG. 2A and subsequent figures are small compared to the overall size of the package substrate 100. For example, the package substrate 100 may have a thickness of up to 1 mm, while a typical nickel layer 112 may be 1 micron (µm) thick. The layers are shown having an exaggerated thickness in order to better show embodiments of the invention.

Figure 2B:
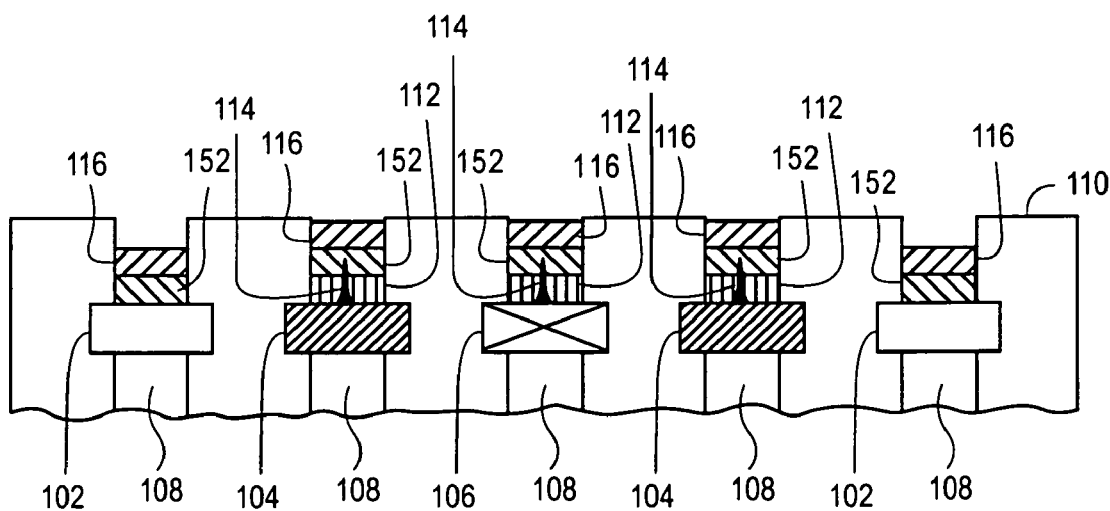
FIG. 2B illustrates an LGA package substrate according to an alternate embodiment of the invention.

FIG. 2B illustrates an LGA package substrate according to an alternate embodiment of the invention. The package substrate 150 is similar to the package substrate 100 except that an EL nickel layer 152 is deposited over the signal pads 102 and the electroplated nickel layers 112. The EL nickel layer 152 is deposited to prevent oxidation, since the immersion gold layer 116 does not. The LGA package is subject to oxidation since the LGA interconnects are not soldered to the pads 102, 104, and 106. Instead, the LGA interconnects form connections using spring pressure.

Only one side of the package substrates 100 and 150 is shown. This side may be, for example, the pads that connect with a BGA or other interconnect to a Printed Circuit Board (PCB). The package substrates 100 and 150 may also include pads to connect with flip chip or other interconnects to form a connection with a semiconductor die. The processes that plate the pads 102, 104, and 106 may also plate the pads that connect the package substrates 100 and 150 to semiconductor dies. The pads coupled to the semiconductor die would, as a result, have the same layers deposited thereon as the pads 102, 104, and 106. This may be advantageous, for example, to help protect against electromigration damage, which may be more likely to occur at the pads that connect with a semiconductor die. In FIGS. 2A–B, as well as the following figures, the pads coupling package substrates to semiconductor dies are not shown in order to simplify the description, and because the processes and layers may be the same. For example, when adding an immersion gold layer 116, the DIG process will also deposit immersion gold on the pads that connect to a semiconductor die.

Figure 3:
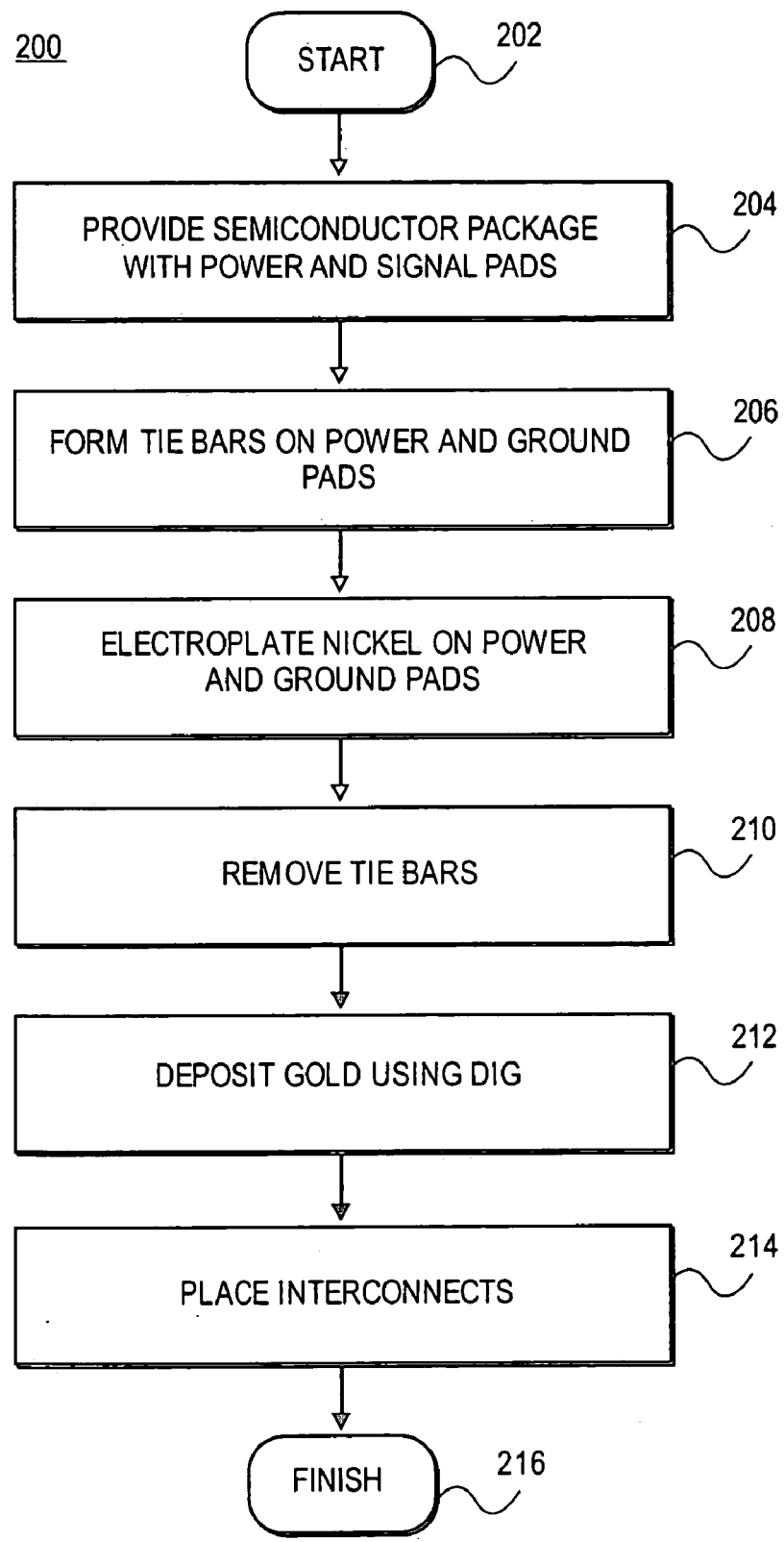
FIG. 3 illustrates an embodiment for forming protective plating layers on terminals of a BGA or PGA package substrate.
Figure 4A:
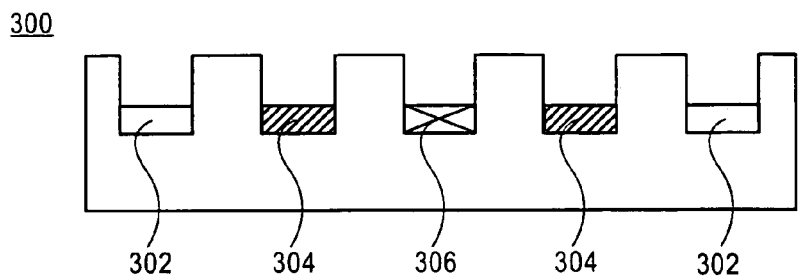
FIGS. 4A–H illustrate the embodiment described in FIG. 3.

FIG. 3 illustrates an embodiment for forming protective plating layers on terminals of a BGA or PGA package substrate. FIGS. 4A–H illustrate the embodiment described in FIG. 3. The process 200 begins in start block 202. In block 204, a semiconductor package with power and signal pads is provided. FIG. 4A illustrates a package substrate 300 having signal pads 302, power pads 304, and a ground pad 306. As above, the signal pads 302 direct signals to and from an attached semiconductor die, the power pads 304 deliver a voltage (e.g., $V_{CC}$, +3.3V, +2.7V, etc.) to the semiconductor die, and the ground pad 306 delivers a ground to the die. Vias and planes are not shown in the package substrate 300 in order not to obscure the invention, but the pads 302, 304, and 306 are coupled to vias.

Figure 4B:
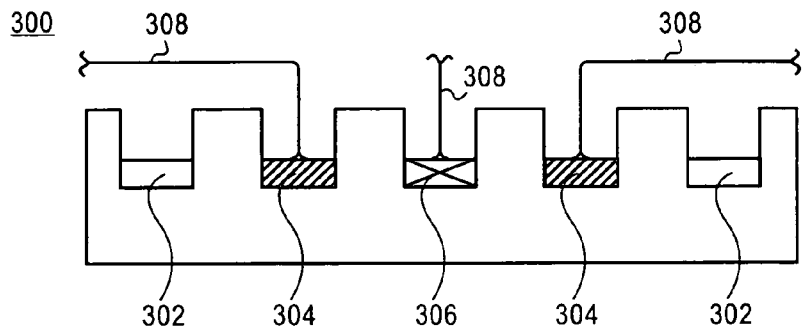
Figure 5:
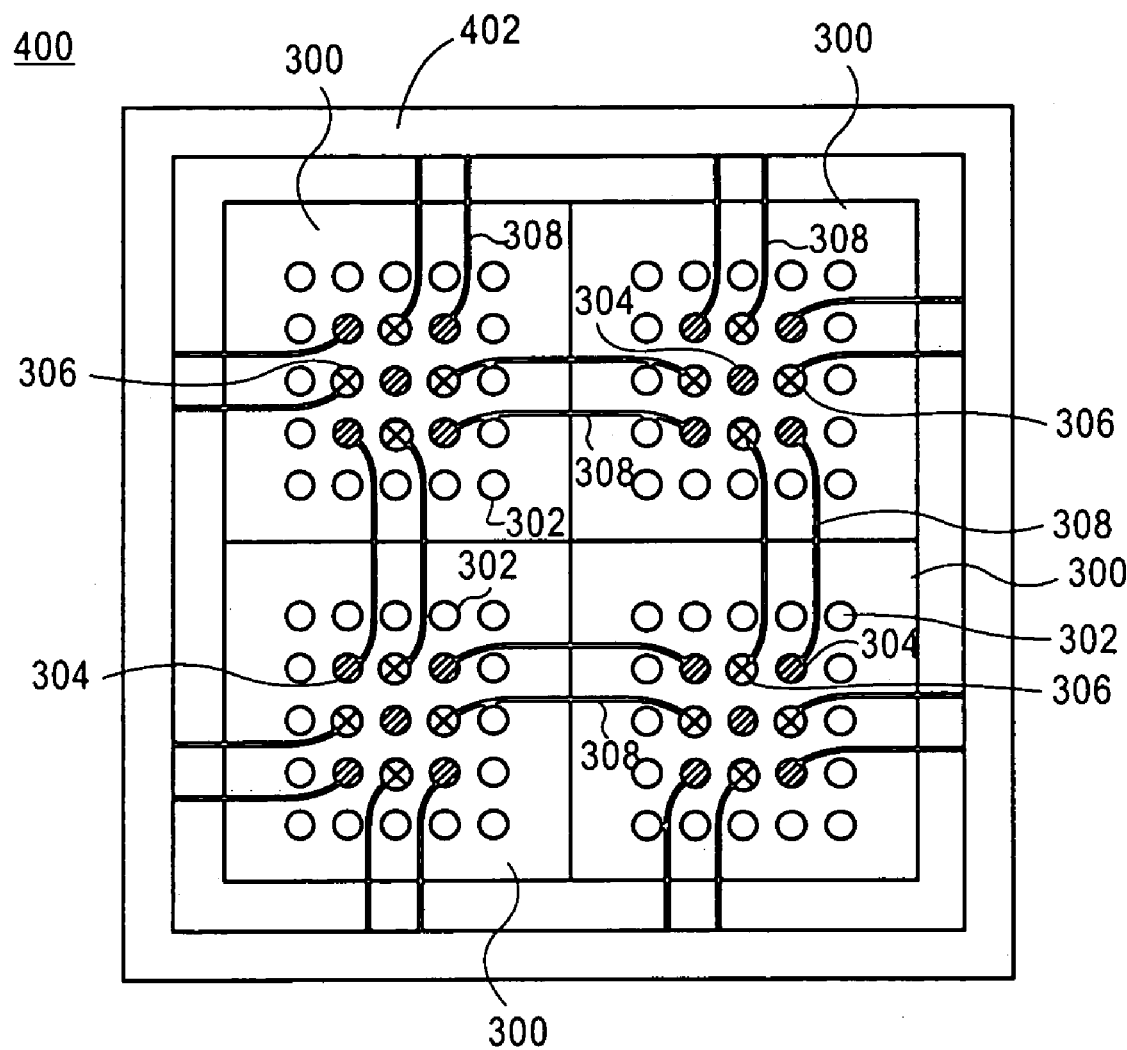
FIG. 5 illustrates a package substrate panel ready for electroplating.

In block 206, tie bars are formed on the power and ground pads 304 and 306. FIG. 4B illustrates a package substrate having tie bars attached to power and ground pads. Tie bars 308 short together and direct current through the power and ground pads 304 and 306 to facilitate the electroplating process. The tie bars 308 can be formed using a subtractive process such as chemical etching of copper sheets. Alternatively, the tie bars 308 are formed with an additive process, such as plating copper where it is needed. FIG. 5 illustrates a package substrate panel ready for electroplating. The panel 400 includes several package substrates 300 before the individual substrates 300 are singulated. It is understood that any number of package substrates 300 may be included in a panel 400. The tie bars 308 are shown shorting the power and ground pads 304 and 306 together. The tie bars 308 are attached to a plating bar 402. The plating bar 402 may be copper or another conductive material and will deliver current through the tie bars 308 to the power and ground pads 304 and 306. The pads that are not connected to the tie bars 308 may be internally connected in the package substrate 300 to supply a current.

Figure 4C:
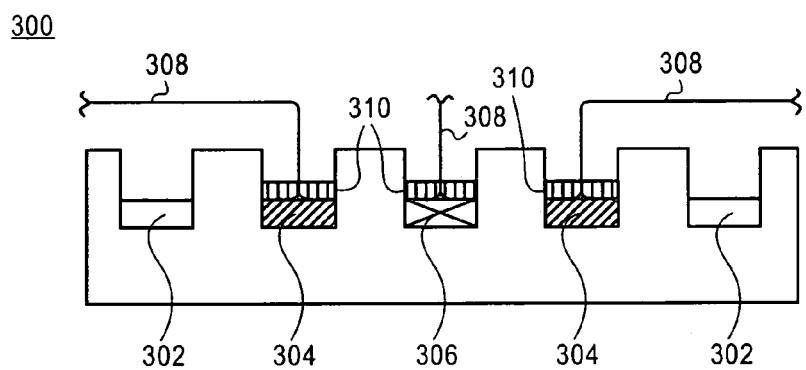

In block 208, nickel is electroplated on the power and ground pads 304 and 306. FIG. 4C illustrates a package substrate having electroplated nickel layer 310 selectively deposited on power and ground pads 304 and 306. A nickel layer 310 is formed on the power and ground pads 304 and 306 using an electroplating process. To perform the electroplating process, the package substrate 300 is immersed in a plating bath. The plating bar 402 has a current driven through it, and the current travels through the tie bars 308. Even though not all of the power and ground pads 304 and 306 are connected by tie bars, they are all connected internally to establish a current through all of the power and ground pads 304 and 306. When the current is delivered, the pads are electrified and a charge is created at the surface of the pads 304 and 306, and nickel ions are attracted to the electrified and charged metal areas. A nickel layer 310 of any appropriate thickness may be deposited. According to one embodiment, a 1 µm layer of nickel 310 is deposited. After electroplating, the plating bar 402 is removed and discarded.

Figure 4D:
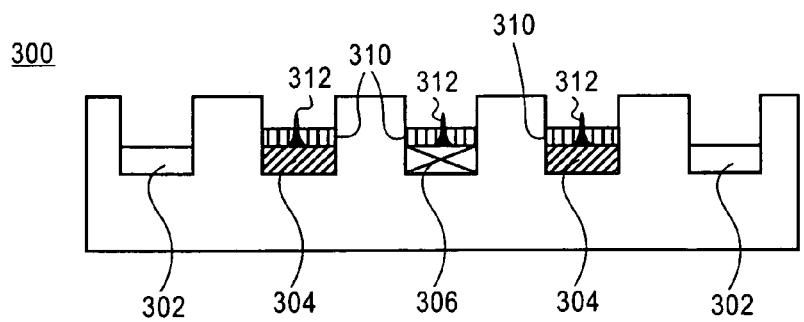

In block 210, the tie bars 308 are removed. FIG. 4D illustrates a package substrate 300 after the tie bars 308 are removed. In one embodiment, the tie bars 308 are removed using a mechanical saw process. Once the tie bars 308 are removed, a stub 312 will remain. The stubs 312 affect signal performance on signal pads 302, but do not affect the current carrying capability of power and ground pads 304 and 306. Therefore, according to one embodiment, electroplating can be used on power and ground pads 304 and 306, but not signal pads 302.

Figure 4E:
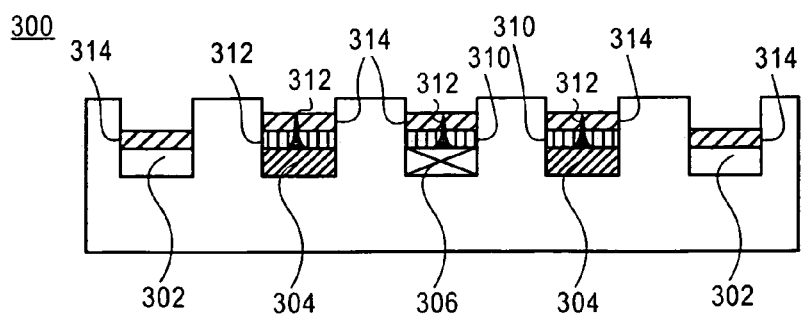

In block 212, an immersion gold layer is deposited using a DIG process. FIG. 4E illustrates an immersion gold layer 314 on the signal pads 302 and the electroplated nickel layers 310. To deposit an immersion gold layer 314, the package substrate 300 is immersed in an immersion gold solution. Gold in the solution displaces copper and nickel, and forms a layer on copper and nickel surfaces, including the signal pads 302 and the electroplated nickel layer 310. The thickness of the immersion gold layer 314 will increase the longer the package substrate 300 is left in the solution. A thickness of approximately 0.1 μm may be appropriate according to one embodiment. The immersion gold layer 314 helps form a strong joint between the interconnects and the pads 302, 304, and 306.

Figure 4F:
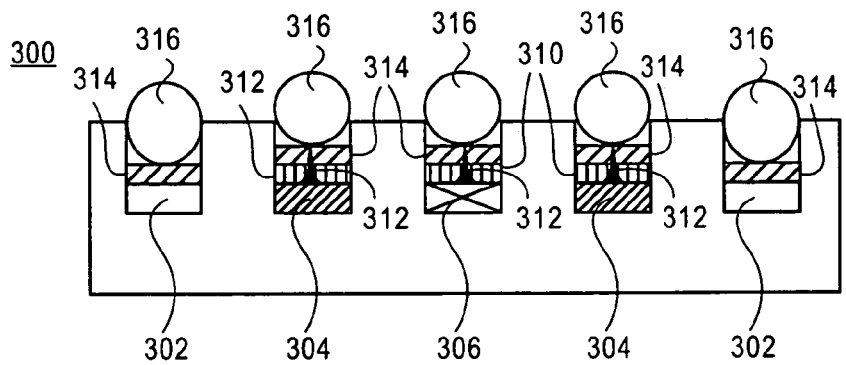

In block 214, interconnects are placed. FIG. 4F shows BGA interconnects 316 attached to the pads 302, 304, and 306. The BGA interconnects 316 are attached using a ball shooter, stencil printer, etc., and form an electrical connection with the pads 302, 304, and 306. The BGA interconnects 316 may be solder, such as a tin solder (Pb/Sn) having a eutectic composition (i.e., 63% Sn, 37% Pb), or other appropriate compositions. The BGA interconnects 316 may also comprise a lead-free solder, such as a tin/silver/copper (Sn/Ag/Cu) alloy. The package substrate 300 can be mounted to a PCB having corresponding pads. The pads on the PCB are also plated in the same way that the package substrate pads 302, 304, and 306 are. This will be shown in FIG. 4H.

Figure 4G:
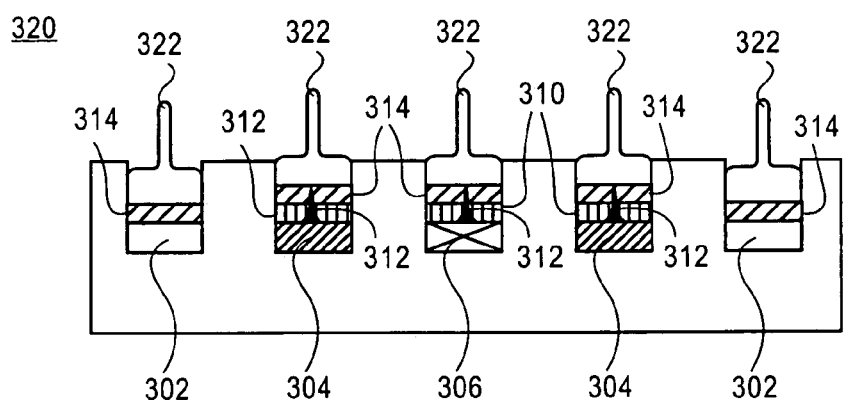

FIG. 4G shows PGA interconnects 322 attached to the pads 302, 304, and 306. The package substrate 320 is an alternate embodiment using PGA interconnects. The PGA interconnects may be attached to the pads 302, 304, and 306 using a stencil printer, etc. The PGA interconnects 322 may be copper or another conductive material, and may also be plated using gold over nickel. The PGA interconnects 322 allow the package 320 to be socket mounted.

Figure 4H:
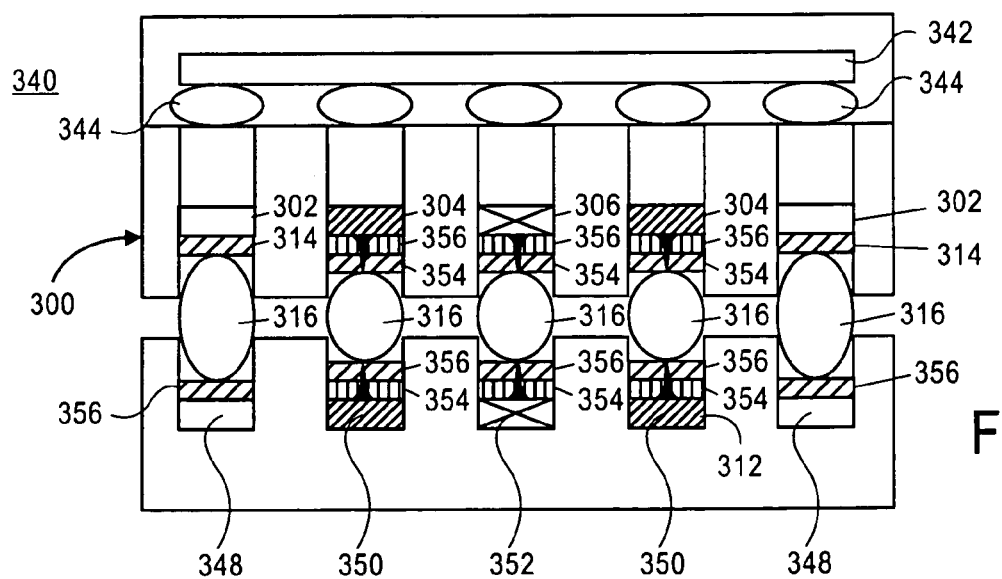

FIG. 4H illustrates a completed BGA package. The package 340 includes a semiconductor die 342. The die 342 may be an integrated circuit (IC) such as a microprocessor, memory, Application Specific IC (ASIC), etc. The die 342 is mounted to the package substrate 300 using a flip chip configuration. Such a configuration includes interconnects 344 to allow electrical communication between the package substrate 300 and the die 342. The interconnects 344 may be Controlled Collapse Chip Connect (C4) interconnects or other flip chip interconnects. The die 342 may also be mounted to the package substrate 300 using wire bonding, Tape Automated Bonding (TAB), etc.

The package substrate 300 communicates with a Printed Circuit Board (PCB) 346. The PCB 346 may be a motherboard, daughterboard, etc. to which the die 342 is to be mounted. After the BGA interconnects 316 are attached to the package substrate 300, the package substrate 300 can be aligned on the PCB 346 and mounted. Once the package substrate 300 is placed on the PCB 346, the assembly is placed in a furnace, where it is heated to reflow the solder in the BGA interconnects 316 and form solder junctions.

The PCB 346 includes signal pads 348, power pads 350, and a ground pad 352 corresponding to the signal pads 302, power pads 304, and ground pad 306. For the same reasons the pads 302, 304, and 306 are plated, the pads 348, 350, and 352 are also plated. An electroplated nickel layer 354 is deposited on the power and ground pads 350 and 352. An immersion gold layer 356 is then deposited on the signal pads 348 and the electroplated nickel layers 354. As with the pads 302, 304, and 306, the pads 348, 350, and 352 are plated to improve signal quality, strengthen solder joints, and prevent electromigration. The process is finished in block 216.

In one embodiment, the package substrate 300 will also include pads to connect with the interconnects 344. These pads will be plated when the pads 302, 304, and 306 are plated. For example, the DIG process will deposit gold on exposed copper, including pads that connect with the interconnects 344. These pads may have the same layers, formed by the same processes, that are shown on the pads 302, 304, and 306 on the package substrate 300, and on the pads 348, 350, and 352 on the PCB 346. These pads are not shown in order to maintain clarity and not obscure the invention.

Figure 6:
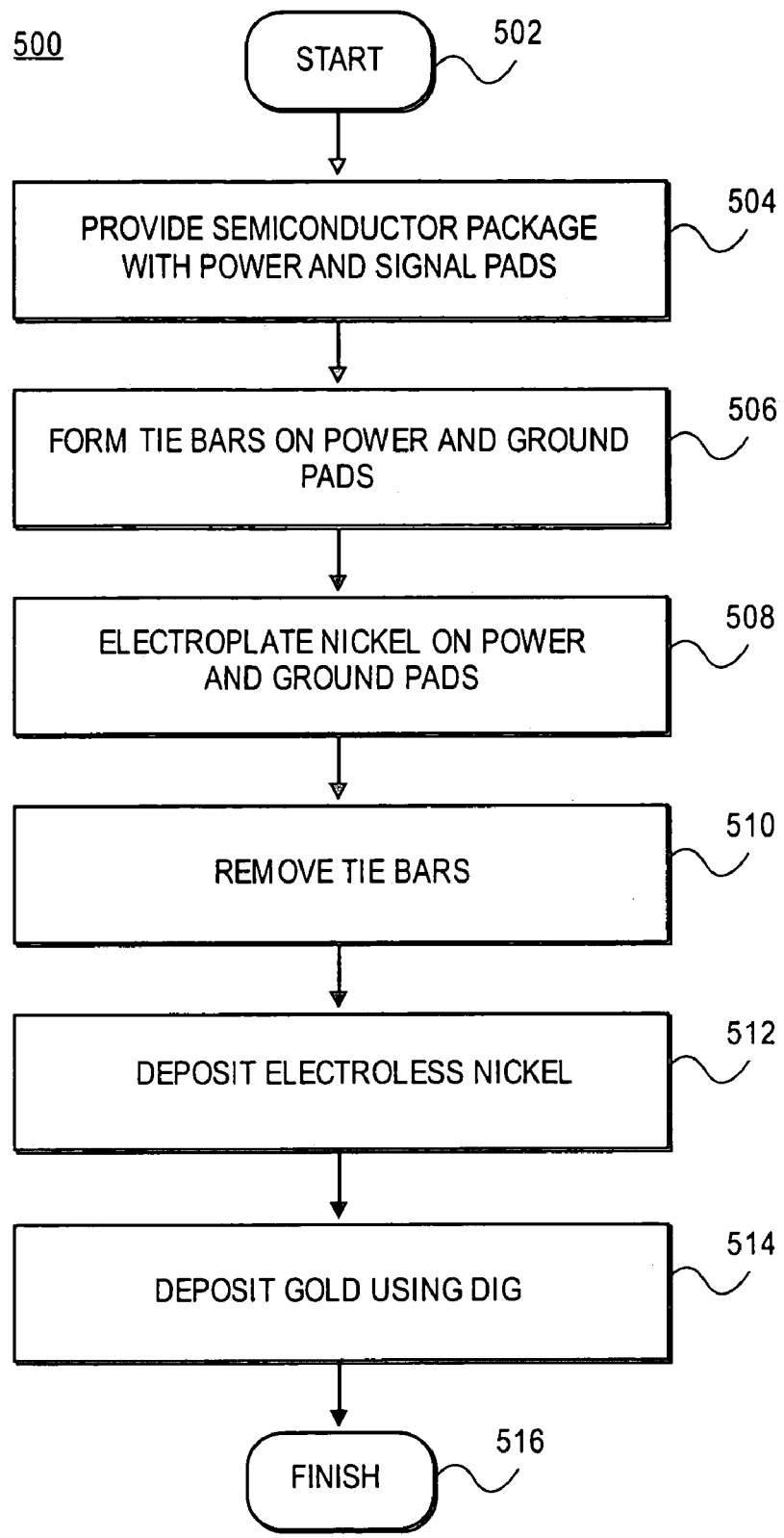
FIG. 6 illustrates an alternate embodiment of the invention for forming protective plating layers on terminals of an LGA package substrate.

FIG. 6 illustrates an alternate embodiment of the invention for forming protective plating layers on terminals of an LGA package substrate. FIGS. 7A–G illustrate the process described in FIG. 6. The process described in FIG. 6 is similar to that described in FIG. 3, excepting that an EL nickel layer is deposited either between an electroplated nickel layer and an immersion gold layer or between a bare pad and an immersion gold layer. Since an LGA interconnect is pressure mounted, oxidation may form on the pads. EL nickel is not used for BGA and PGA interconnects, since the EL nickel is chemically attracted to the plated areas and is thus weakens the solder joint formed when using BGA and PGA packages.

Figure 7A:
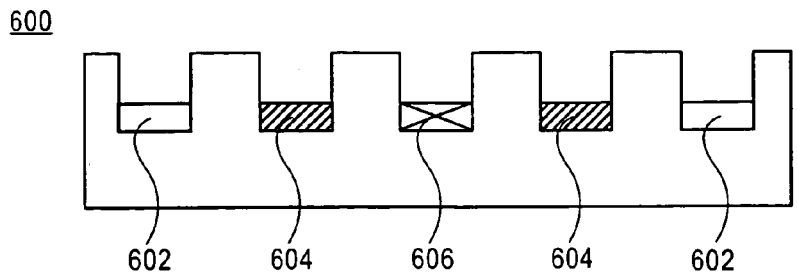
FIGS. 7A–G illustrate the process described in FIG. 6.
Figure 7B:
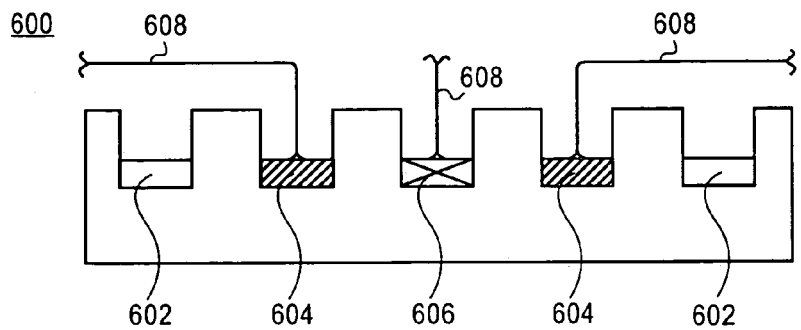
Figure 7C:
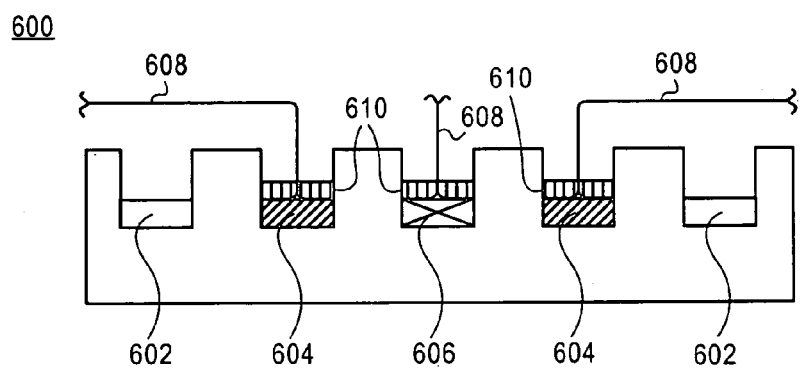

The process 500 starts in start block 502. In block 504, a semiconductor package having power delivery and signal pads is provided. FIG. 7A illustrates a package substrate 600. Signal pads 602, power pads 604, and a ground pad 606 are similar to their counterparts 302, 304, and 306. In block 506, tie bars are formed on the power and ground pads 604 and 606. FIG. 7B illustrates tie bars 608 formed on the power and ground pads 604 and 606. In block 508, nickel is electroplated on the power and ground pads 604 and 606. FIG. 7C illustrates a package substrate having a nickel layer 610 formed on power and ground pads. The electroplated nickel layer 610 protects the power and ground pads 604 and 606 from electromigration.

Figure 7D:
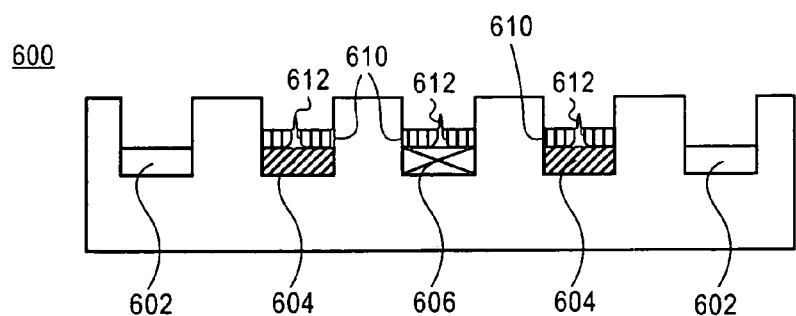
Figure 7E:
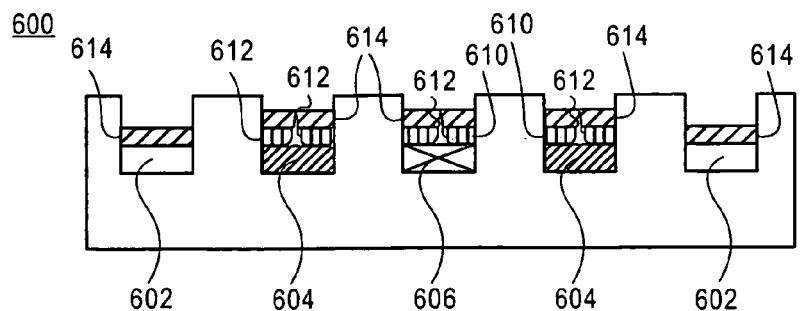

In block 510, the tie bars 608 are removed. FIG. 7D illustrates a package substrate 600 after tie bars 608 are removed. The removal of the tie bars 608 leaves a stub 612 on the power and ground pads 604 and 606. In block 512, EL nickel is deposited on the signal pads 602, and the electroplated nickel layers 610. The power and ground pads 604 and 606 already have an electroplated nickel layer 610 sufficient to protect them from oxidation, a nickel layer is needed on the signal pads 602 to provide oxidation protection. FIG. 7E illustrates an EL nickel layer 614 deposited on the signal pads 602 and the electroplated nickel layers 610. The electroless plating process deposits nickel on activated metals. For example, a palladium or other solution can activate an exposed metal surface, such as the signal pads 602 and the nickel layer 610. Once the signal pads 602 and electroplated nickel layers 610 are activated, the package substrate 600 is immersed in an electroless plating bath, and nickel ions are attracted to the activated areas. An EL nickel layer 614 is formed over the signal pads 602 and the electroplated nickel layer 610. In one embodiment, the EL nickel layer has a thickness of 1 μm. The EL nickel layer helps protect against oxidation, as well as providing extra protection against electromigration for the power and ground pads 604 and 606.

Figure 7F:
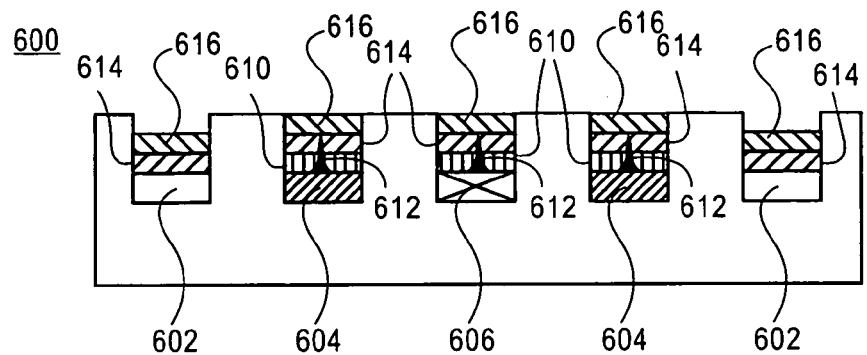

In block 514, an immersion gold layer is deposited using DIG. FIG. 7F illustrates a package substrate having an immersion gold layer deposited 616 over the EL nickel layer 614. As above, the immersion gold layer 616 provides a protective finish for the pads 602, 604, and 606, as well as the nickel layers 610 and 614. The plating process is finished in block 516.

Figure 7G:
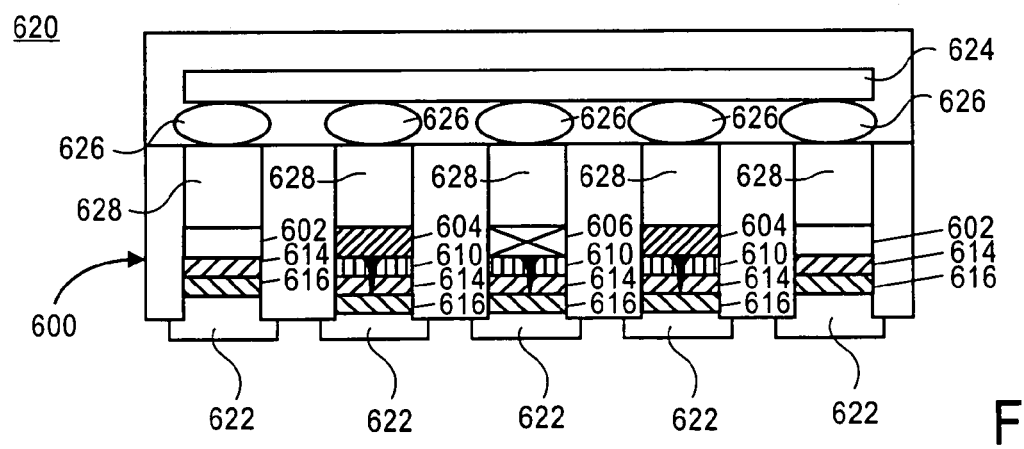

FIG. 7G illustrates a finished LGA package 620 according to an embodiment of the invention. The LGA package 620 is a socket mount package, like the PGA package 320. A socket connects the package 620 with a motherboard or other PCB. The package 620 is coupled with a socket through lands 622. The lands 622 are pressure mounted against the top immersion gold layer 616 on the pads 602, 604, and 606. It is again noted that the thickness of the layers is exaggerated in the figures to clearly show the layers.

The package 620 also shows a semiconductor die 624, which may be an IC such as a microprocessor, memory, ASIC, etc. As shown here, the die 624 is attached to the package substrate 600 using a flip chip configuration. The interconnects 626, which may be controlled collapse chip connections (C4s) or other flip chip interconnects are coupled to the pads 602, 604, and 606 through the vias 628. The vias 628 are shown in a very simple manner in order to not obscure the invention, however it is understood that any configuration of vias and planes in the package substrate 600 may be used. As mentioned above, the package substrate 600 may include pads to connect with the interconnects 626. These pads may also include nickel and gold plated layers, but are not shown in order to maintain clarity.

A method for selectively plating terminals and a package substrate is disclosed. In one embodiment, for example, when using a BGA or PGA interconnect, power and ground pads are selectively electroplated with nickel. After the power and ground pads are electroplated, all of the pads including the signal pads are plated with an immersion gold. The immersion gold improves joint strength, without affecting signal integrity. The electroplated nickel layer improves current carrying capability because of it's resistance to electromigration, but affects signal integrity so it should only be used on power and ground pads. In another embodiment, for example when using LGA interconnects, a nickel layer is needed on all pads including signal pads to protect against oxidation. The nickel layer can be deposited on all the pads without using an electroplating method using an electroless plating method. Using the electroless plating method, no tie bar stubs are left and signal integrity is not compromised.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are accordingly to be regarded in an illustrative rather than in a restrictive sense.

What is claimed is:

1. A method comprising:
    providing a semiconductor package having a first pad set and a second pad;
    using a first process to deposit a layer of a first type of metal on the first pad set and not on the second pad;
    using a second process to both deposit a second type of metal on the second pad and deposit the second type of metal over the layer of the first type of metal on the first pad set.

2. The method of claim 1, further comprising:
    depositing both a third layer over the first pad set and depositing the third layer over the second pad with the second type of metal using a third process.

3. The method of claim 2, wherein using the third process comprises using an electroless plating process.

4. The method of claim 2, further comprising:
    placing a Land Grid Array (LGA) interconnect on the first pad set and second pad.

5. The method of claim 1, wherein the first type of metal comprises nickel, and the second type of metal comprises gold.

6. The method of claim 5, wherein using the first process comprises using an electroplating process, and wherein using the second process comprises using a direct immersion gold (DIG) process.

7. The method of claim 6, further comprising:
    forming a tie bar on the first pad set to facilitate the electroplating process.

8. The method of claim 7, further comprising:
    forming a plating bar surrounding the semiconductor package and coupled to the tie bar to direct current to the first pad set.

9. The method of claim 1, wherein the first pad set comprises a power pad and a ground pad, and wherein the second pad comprises a signal pad.

10. The method of claim 1, further comprising:
    placing an interconnect on the first pad set and the second pad.

11. The method of claim 10, wherein the interconnect is chosen from the group consisting of a Ball Grid Array (BGA) interconnect, a Pin Grid Array (PGA) interconnect, and a Controlled Collapse Chip Connect (C4) interconnect.

12. A method comprising:
    providing a semiconductor package having a power pad and a signal pad;
    attaching a tie bar to the power pad;
    depositing a nickel layer on the power pad using an electroplating process by directing current through the tie bar; and
    depositing a gold layer on the nickel layer and the signal pad and the nickel layer using a direct immersion gold (DIG) process.

13. The method of claim 12, further comprising:
    depositing a second nickel layer on the signal pad and the nickel layer using an electroless deposition process before depositing the gold layer.

14. The method of claim 12, further comprising:
    attaching the pads to a ball grid array (BGA) interconnect.

15. The method of claim 12, further comprising:
    attaching the pads to a pin grid array interconnect.

16. The method of claim 12, wherein directing comprises attaching a plating bar to the tie bar, wherein the plating bar surrounds the package substrate, and electrifying the plating bar.

* * * * *